(12) United States Patent
Lenz et al.

(10) Patent No.: US 11,851,378 B2
(45) Date of Patent: Dec. 26, 2023

(54) ELECTROSTATIC FILAMENT DISPERSAL FOR CMC

(71) Applicant: Raytheon Technologies Corporation, Farmington, CT (US)

(72) Inventors: Brendan M. Lenz, Wethersfield, CT (US); Sarah A. Frith, Jupiter, FL (US); Daniel L. Becerra, West Hartford, CT (US); Olivier H. Sudre, Glastonbury, CT (US)

(73) Assignee: RTX Corporation, Farmington, CT (US)

(*) Notice: Subject to any disclaimer, the term of this patent is extended or adjusted under 35 U.S.C. 154(b) by 268 days.

(21) Appl. No.: 17/375,557

(22) Filed: Jul. 14, 2021

(65) Prior Publication Data
US 2023/0019661 A1    Jan. 19, 2023

(51) Int. Cl.
| | |
|---|---|
| *C04B 35/80* | (2006.01) |
| *B28B 23/00* | (2006.01) |
| *C04B 35/628* | (2006.01) |
| *C04B 35/634* | (2006.01) |
| *C23C 16/02* | (2006.01) |
| *D03D 3/00* | (2006.01) |
| *D06N 3/00* | (2006.01) |
| *D06M 10/10* | (2006.01) |

(52) U.S. Cl.
CPC .......... *C04B 35/80* (2013.01); *B28B 23/0006* (2013.01); *C04B 35/62863* (2013.01); *C04B 35/62884* (2013.01); *C04B 35/6342* (2013.01); *C04B 35/63416* (2013.01); *C23C 16/02* (2013.01); *D03D 3/005* (2013.01); *D06N 3/0006* (2013.01); *D06N 3/0015* (2013.01); *C04B 2235/3826* (2013.01); *C04B 2235/5244* (2013.01); *C04B 2235/5256* (2013.01); *C04B 2235/614* (2013.01); *D06M 10/10* (2013.01)

(58) Field of Classification Search
None
See application file for complete search history.

(56) References Cited

U.S. PATENT DOCUMENTS

| | | |
|---|---|---|
| 3,657,871 A | 4/1972 | Uchiyama et al. |
| 4,009,508 A | 3/1977 | Sternberg |
| | (Continued) | |

FOREIGN PATENT DOCUMENTS

DE           10007543 A1 *  9/2001  ............ D06M 10/04

OTHER PUBLICATIONS

Extended European Search Report for EP Application No. 22184882.3, dated Dec. 5, 2022, 5 pages.

*Primary Examiner* — Joel G Horning
(74) *Attorney, Agent, or Firm* — Kinney & Lange, P.A.

(57) ABSTRACT

A method of preparing a woven fabric material for use in a ceramic matrix composite includes passing a desized woven fabric tape having a first inter-filament spacing through a dispersal module configured to transform the desized woven fabric tape into a dispersed woven fabric tape having a second inter-filament spacing greater than the first inter-filament spacing. The dispersal module includes a first charging element with a charged surface and disposed to apply an electric charge to the desized woven fabric tape. The method further includes applying a polymer binder to the dispersed woven fabric tape to create a stabilized woven fabric tape having the second inter-filament spacing.

20 Claims, 3 Drawing Sheets

(56) References Cited

U.S. PATENT DOCUMENTS

Figure 1:
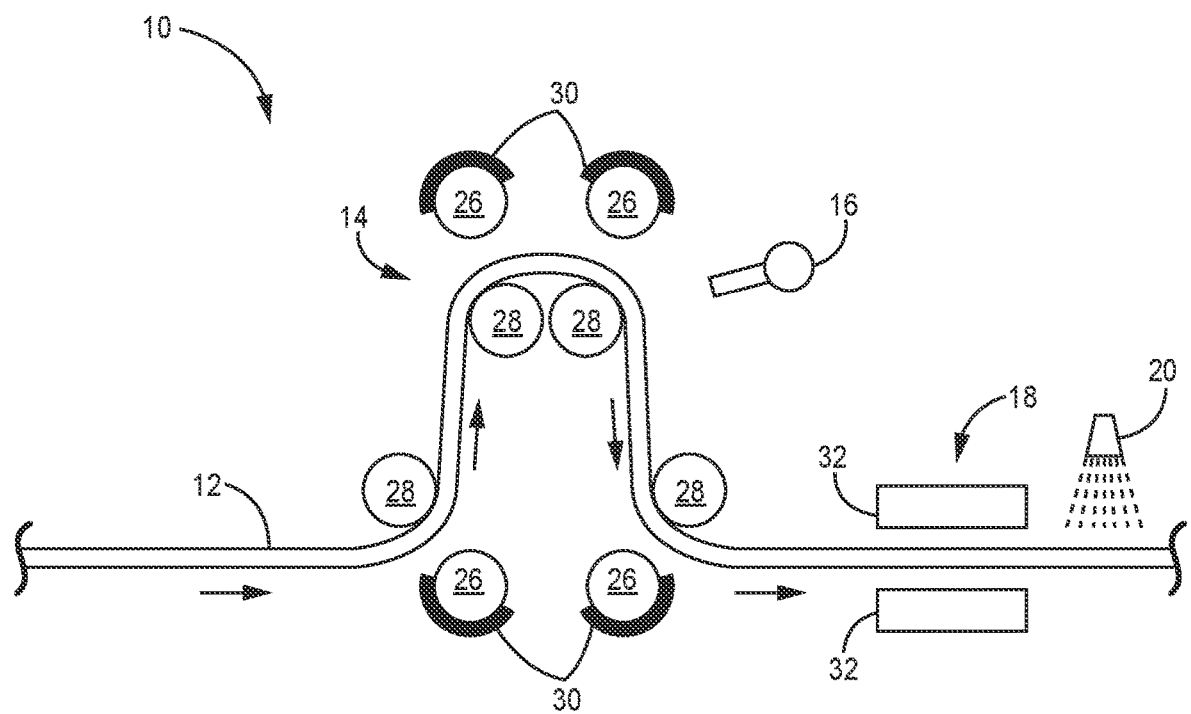

| | | |
|---|---|---|
| 4,208,366 A | 6/1980 | Kinney |
| 5,817,223 A | 10/1998 | Maloney |
| 2018/0230062 A1 | 8/2018 | Grossman et al. |
| 2019/0299545 A1 | 10/2019 | Zhang et al. |

* cited by examiner

ELECTROSTATIC FILAMENT DISPERSAL FOR CMC

BACKGROUND

The present invention relates to ceramic matrix composites, and more particularly, to the preparation of woven ceramic fabrics for use in ceramic matrix composites.

In the processing of ceramic matrix composites (CMCs), there is a need to infiltrate matrix within and around tow bundles. In a woven CMC system, there are often large voids that exist between adjacent tows of a preform that can become large defects after matrix infiltration. Such defects diminish interlaminar properties of the composite structure. Additionally, the inherent spacing between filaments of the tows and subsequent preforming processes such as lay-up and debulking often cause the shape of these tows to contract, creating even larger defects and reducing surface contact area between plies. By dispersing the individual filaments of the tows, the contact surface area between plies can increase, resulting in a more homogenous pore distribution.

SUMMARY

A method of preparing a woven fabric material for use in a ceramic matrix composite includes passing a desized woven fabric tape having a first inter-filament spacing through a dispersal module configured to transform the desized woven fabric tape into a dispersed woven fabric tape having a second inter-filament spacing greater than the first inter-filament spacing. The dispersal module includes a first charging element with a charged surface and disposed to apply an electric charge to the desized woven fabric tape. The method further includes applying a polymer binder to the dispersed woven fabric tape to create a stabilized woven fabric tape having the second inter-filament spacing.

A system for processing a woven fabric material for use in a ceramic matrix composite includes a dispersal module configured to transform a desized woven fabric tape into a dispersed woven fabric tape having a second inter-filament spacing greater than the first inter-filament spacing. The dispersal module includes a first charging element having a charged surface and disposed to apply an electric charge to the desized woven fabric tape. The system further includes an applicator downstream of the dispersal module for applying a polymer material to the dispersed woven fabric tape to create a stabilized woven fabric tape having the second inter-filament spacing.

BRIEF DESCRIPTION OF THE DRAWINGS

FIG. 1 is a simplified illustration of a system used to prepare a woven ceramic fabric.

FIG. 2 is an enlarged cross-sectional view of a ceramic tow of the woven ceramic fabric showing the tow in a pre-dispersed (left) state and a dispersed (right) state.

FIG. 3 is a flow chart illustrating steps of preparing the woven ceramic fabric for use in a ceramic matrix composite.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a system and method for dispersing tow filaments within a woven ceramic fabric. An electric charge can be induced in the woven fabric during processing such that individual filaments within the tows disperse due to repulsion of like charges. Charging of the woven fabric can be accomplished using charged rollers or other conductive surfaces through/along which the fabric is passed. The dispersed fabric has a more uniform pore distribution to facilitate more even infiltration with ceramic particles during densification.

FIG. 1 is a simplified illustration of system 10 used to disperse woven fabric tape 12 prior to preforming and densification. FIG. 2 is a simplified cross-sectional view of a fiber tow 22 of woven fabric tape 12. Tow 22 is shown in a pre-dispersed (left) and dispersed (right) state. FIG. 3 is a flowchart illustrating selected steps of method 100, used to prepare woven fabric tape 12 for use in a CMC. Steps 102-112 of method 100 are described below in combination with FIGS. 1 and 2. FIGS. 1-3 are described together.

System 10 includes first charging element 14, optional air knife 16, second charging element 18, and applicator 20, through which woven fabric tape 12 is passed in the direction indicated by arrows. In an exemplary embodiment, woven fabric tape 12 is formed from tows 22 of bundled silicon carbide filaments 24. Other suitable ceramics are contemplated herein. Tows 22 are preferably desized by a prior heat treatment or other suitable process to remove their polymer coatings in order to enhance dispersal of filaments 24. Detensioning of woven fabric tape 12 may also be desirable to further enhance dispersal. Woven fabric tape 12 can be arranged in various weave patterns such as plain, harness (e.g., 3, 5, 8, etc.), twill, braid, or non-symmetric.

At step 102, woven fabric tape 12 is passed through first charging element 14. In the embodiment shown, first charging element 14 includes charged and grounded surfaces as charged rollers 26 and grounded rollers 28. Each of charged rollers 26 and grounded rollers 28 can be formed from a metallic material, with charged rollers 26 also having an attached polymer or foam material for insulation and to prevent grounding. Charged rollers 26 could alternatively be formed from a polymer or glass material. In the illustrated embodiment, a friction pad 30 abuts each charged roller 26 for the purpose of charging each charged roller 26. In an alternative embodiment, friction pads 30 can be omitted if charged rollers 26 are charged in a manner other than by friction (e.g., via an applied electric current). Woven fabric tape 12 can pass through charging element 14 in physical contact with grounded rollers 28, while charged rollers 26 are offset from (i.e., not in physical contact with) woven fabric tape 12. Charged rollers 26 rotate in contact with friction pads 30 to charge rollers 26. In the embodiment shown, friction creates negatively charged rollers 26. The negative charge induces a positive charge in woven fabric tape 12, causing adjacent tows 22 and filaments 24 to disperse through repulsion of like charges. As such, woven fabric tape 12 exits first charging element 14 in a dispersed state (i.e., dispersed woven fabric tape 12).

In an alternative embodiment, desized woven fabric tape 12 can be charged using a non-induction method. For example, first charging element 14 can be arranged as an electron gun or electrostatic generator to charge desized woven fabric tape 12. First charging element 14 could alternatively be formed from a polymer material and be disposed to frictionally charge desized woven fabric tape 12 by rubbing against it. In such embodiments, a grounded surface may not be required. Other suitable charging means are contemplated herein.

At step 104, a stream of air can optionally be applied to woven fabric tape 12 with air knife 16. Air knife 16 can be positioned to apply a stream of air woven fabric tape 12 during or just after passing through charging element 14. Air knife 16 further disperses tows 22 through mechanical means.

At step 106, woven fabric tape 12 can be collected by second charging element 18. Second charging element 18 can be arranged as two charged surfaces 32 disposed on opposite sides (i.e., top and bottom) of woven fabric tape 12. For a positively charged woven fabric tape 12, charging element 18 can be negatively charged to further enhance the dispersed state of woven fabric 12 as positively charged sub-elements (i.e., tows 22 and filaments 24) are pulled toward one or the other of charged surfaces 32 as woven fabric tape 12 passes between surfaces 32. Second charging element 18 can also help dissipate the charge in woven fabric tape 12 before it undergoes subsequent processing.

In this regard, first charging element 14, optional air knife 16, and second charging element 18 act as a dispersal module to non-mechanically (through electrostatic repulsion) and mechanically (through an applied stream of air) disperse and separate filaments 24 and tows 22 of woven fabric tape 12. In alternative embodiments, the dispersal module can include any elements present (e.g., only charging elements 14 and 18) used for dispersing woven fabric tape 12.

The speed and extent to which woven fabric tape 12 is charged depends on a variety of factors, such as the number of charged rollers 26 and/or grounded rollers 28, and/or the distance between charged rollers 26 and woven fabric tape 12. Additionally, conditions of woven fabric tape 12 can influence charging. For example, the thickness/number of filaments 24 per tow 22 (e.g., ranging from 500 to 2,000), number of tows 22, and amount of residual polymer coating can all influence charging. It should also be understood that the charge of rollers 26 can be reversed (i.e., positive) such that a negative charge can be induced in woven fabric tape 12 without departing from the scope of this invention.

At step 108, dispersed woven fabric tape 12, which was previously desized and possibly detensioned to facilitate dispersal, can be stabilized in the dispersed state using a polymer binder to create a stabilized woven fabric tape 12. Applicator 20 can be a source of a polymer binder material (e.g., conventional sprayer, electrostatic sprayer, bath, etc.). Exemplary polymer binders can include poly-vinyl alcohol (PVA) or poly-vinyl butyral (PVB). Once the binder is applied, woven fabric tape 12 can be dried using heat or an air dryer if desired.

Figure 2:
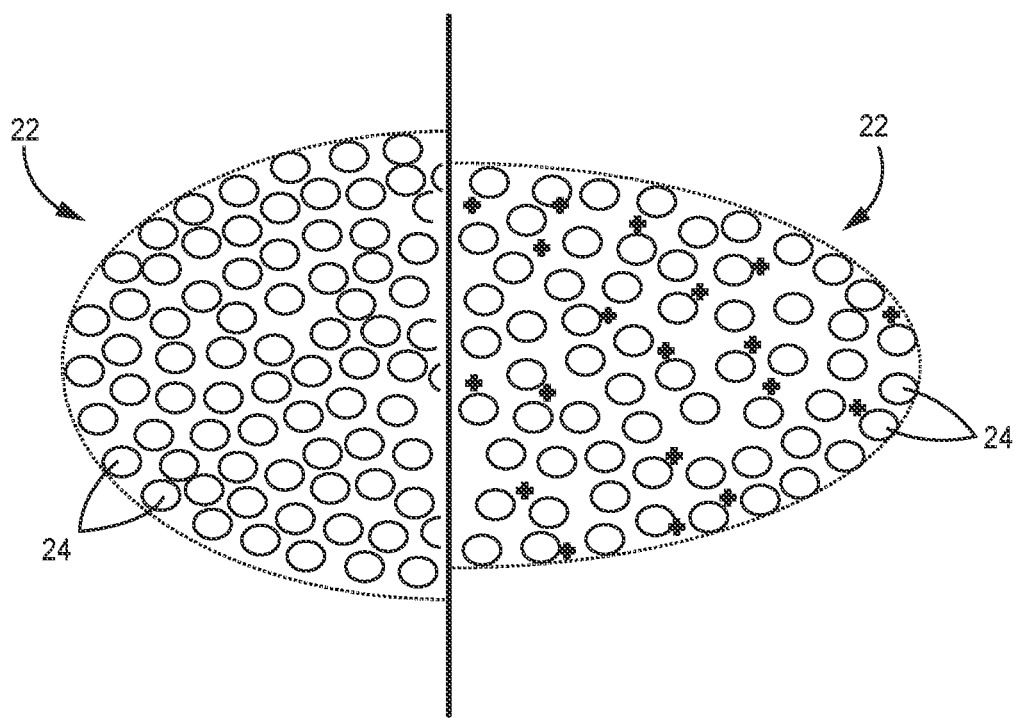
Figure 3:
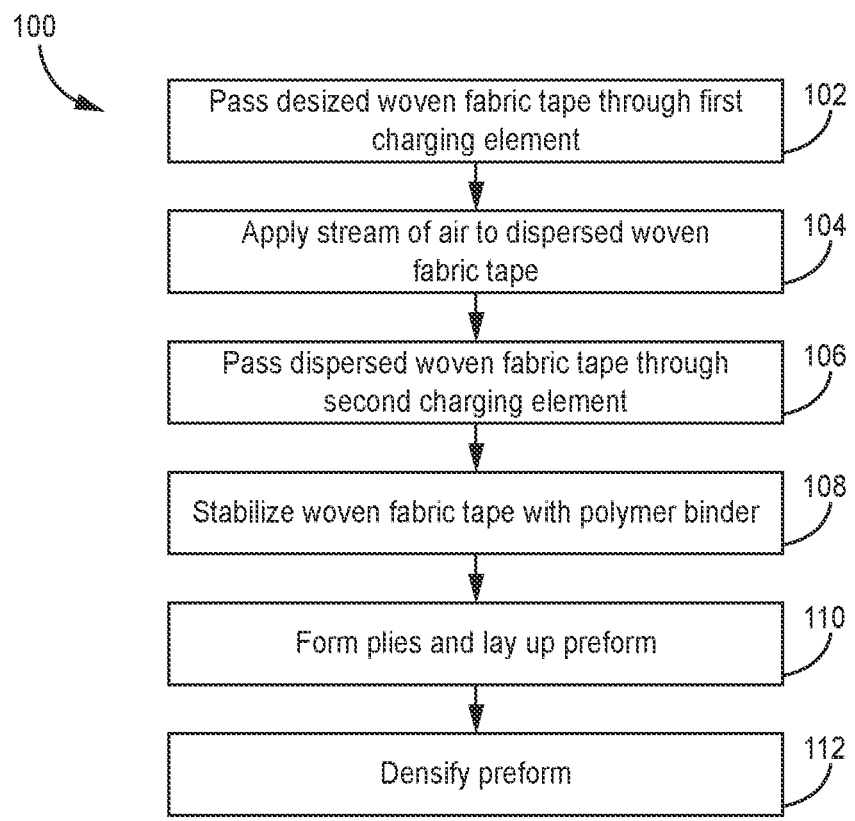

A dispersed/stabilized woven fabric tape 12 can differ from the original woven fabric tape 12 in several ways. First, repulsive electrical forces cause individual filaments 32 to push away from adjacent filaments, causing a "spreading out" of a tow 22, as shown in FIG. 2. Adjacent tows 22 can experience similar repulsion and spreading. Accordingly, dispersed woven fabric tape 12 can have any of a greater number of tows 12 due to spreading and regrouping of filaments 24 in smaller numbers, greater inter-filament spacing within a tow 22, and reduced inter-tow spacing due to the increase in number of tows 22 and/or spreading of tows 22. For example, inter-filament spacing can double or triple from the original spacing. Additionally, the number of tows 22 in the dispersed woven fabric tape 12 can be two, three, or four times greater. It should further be understood that individual filaments 24 may disperse in such a manner as to be grouped into more than one adjacent tow 22 along a length of the filament, such that tows 22 can intermingle.

At step 110, the stabilized woven fabric tape 12 can be cut into plies and arranged into a desired two or three dimensional preform structure. Step 110 can also include localized application of ceramic particles to enhance regions of the preform structure.

At step 112, the preform structure can undergo matrix formation and densification using a chemical vapor infiltration or deposition (CVI or CVD) process. During densification, the plies are infiltrated by reactant vapors, and a gaseous precursor deposits on the fibers. The matrix material can be a silicon carbide or other suitable ceramic material. Densification is carried out until the resulting CMC has reached the desired residual porosity.

It may be desirable to control the environment surrounding system 10 to optimize dispersal of woven fabric tape 12. Such an environment can, for example, include a relatively low level of humidity and be generally free of contaminants such as dust or other particulates.

The dispersed woven ceramic fabric formed using method 100 has more evenly distributed surface area for receiving ceramic particles during infiltration due to the spreading of filaments and tows allowing for more robust matrix formation. Infiltration time may also be reduced as the vapors can more easily penetrate the increased size of filament-to-filament pores. The resulting CMC formed with the woven fabric can be incorporated into aerospace, maritime, or industrial equipment, to name a few, non-limiting examples.

Discussion of Possible Embodiments

A method of preparing a woven fabric material for use in a ceramic matrix composite includes passing a desized woven fabric tape having a first inter-filament spacing through a dispersal module configured to transform the desized woven fabric tape into a dispersed woven fabric tape having a second inter-filament spacing greater than the first inter-filament spacing. The dispersal module includes a first charging element with a charged surface and disposed to apply an electric charge to the desized woven fabric tape. The method further includes applying a polymer binder to the dispersed woven fabric tape to create a stabilized woven fabric tape having the second inter-filament spacing.

The method of the preceding paragraph can optionally include, additionally and/or alternatively, any one or more of the following features, configurations and/or additional components:

In the above method, the woven fabric material can include silicon carbide.

In any of the above methods, the dispersal module can further include a second charging element downstream of the first charging element, and passing the desized woven fabric tape through the dispersal module can include passing the desized woven fabric tape sequentially though the first and second charging elements.

In any of the above methods, the charged surface of the first charging element can have the same electric charge as the second charging element.

In any of the above methods, the first charging element can further include a grounded surface in physical contact with the desized woven fabric tape.

In any of the above methods, the grounded surface can include a plurality of grounded rollers.

In any of the above methods, the charged surface can include a plurality of charged rollers physically spaced apart from the desized woven fabric tape.

Any of the above methods can further include forming the stabilized woven fabric tape into a plurality of plies, laying up the plurality of plies to form a preform, and densifying the preform.

In any of the above methods, the step of densifying the preform can include one of a chemical vapor infiltration and a chemical vapor deposition process.

A system for processing a woven fabric material for use in a ceramic matrix composite includes a dispersal module configured to transform a desized woven fabric tape into a dispersed woven fabric tape having a second inter-filament spacing greater than the first inter-filament spacing. The dispersal module includes a first charging element having a charged surface and disposed to apply an electric charge to the desized woven fabric tape. The system further includes an applicator downstream of the dispersal module for applying a polymer material to the dispersed woven fabric tape to create a stabilized woven fabric tape having the second inter-filament spacing.

The system of the preceding paragraph can optionally include, additionally and/or alternatively, any one or more of the following features, configurations and/or additional components:

In the above system, the woven fabric material can include silicon carbide.

In any of the above systems, the charged surface can include a plurality of charged rollers physically spaced apart from the desized woven fabric tape.

In any of the above systems, the first charging element can further include a grounded surface in physical contact with the desized woven fabric tape.

In any of the above systems, the grounded surface can include a plurality of grounded rollers.

In any of the above systems, the plurality of grounded rollers and the plurality of charged rollers can be formed from a metallic material.

In any of the above systems, the plurality of charged rollers can further be formed from an insulating material.

In any of the above systems, the dispersal module can further include a second charging element downstream of the first charging element.

In any of the above systems, the second charging element can include a pair of charged surfaces having an opposite electric charge from the dispersed woven fabric tape.

In any of the above systems, the polymer material can be one of poly-vinyl alcohol (PVA) and poly-vinyl butyral (PVB).

In any of the above systems, the applicator can be a conventional or electrostatic sprayer.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of preparing a woven fabric material for use in a ceramic matrix composite, the method comprising:
   passing a desized woven fabric tape having a first inter-filament spacing through a dispersal module configured to transform the desized woven fabric tape into a dispersed woven fabric tape having a second inter-filament spacing greater than the first inter-filament spacing, the dispersal module comprising:
      a first charging element disposed to apply an electric charge to the desized woven fabric tape, the first charging element comprising a charged surface; and
   applying a polymer binder to the dispersed woven fabric tape to create a stabilized woven fabric tape having the second inter-filament spacing.

2. The method of claim 1, wherein the woven fabric material comprises silicon carbide.

3. The method of claim 1, wherein the dispersal module further comprises a second charging element downstream of the first charging element, and wherein passing the desized woven fabric tape through the dispersal module comprises passing the desized woven fabric tape sequentially though the first and second charging elements.

4. The method of claim 3, wherein the charged surface of the first charging element has the same electric charge as the second charging element.

5. The method of claim 1, wherein the first charging element further comprises a grounded surface in physical contact with the desized woven fabric tape.

6. The method of claim 5, wherein the grounded surface comprises a plurality of grounded rollers.

7. The method of claim 6, wherein the charged surface comprises a plurality of charged rollers physically spaced apart from the desized woven fabric tape.

8. The method of claim 1, and further comprising:
   forming the stabilized woven fabric tape into a plurality of plies;
   laying up the plurality of plies to form a preform; and
   densifying the preform.

9. The method of claim 8, wherein the step of densifying the preform comprises one of a chemical vapor infiltration and a chemical vapor deposition process.

10. A system for processing a woven fabric material for use in a ceramic matrix composite, the system comprising:
    a dispersal module configured to transform a desized woven fabric tape into a dispersed woven fabric tape having a second inter-filament spacing greater than the first inter-filament spacing, the dispersal module comprising:
       a first charging element disposed to apply an electric charge to the desized woven fabric tape, the first charging element comprising a charged surface; and
    an applicator downstream of the dispersal module for applying a polymer material to the dispersed woven fabric tape to create a stabilized woven fabric tape having the second inter-filament spacing.

11. The system of claim 10, wherein the woven fabric material comprises silicon carbide.

12. The system of claim 10, wherein the charged surface comprises a plurality of charged rollers physically spaced apart from the desized woven fabric tape.

13. The system of claim 12, wherein the first charging element further comprises a grounded surface in physical contact with the desized woven fabric tape.

14. The system of claim 13, wherein the grounded surface comprises a plurality of grounded rollers.

15. The system of claim 14, wherein the plurality of grounded rollers and the plurality of charged rollers are formed from a metallic material.

16. The system of claim 15, wherein the plurality of charged rollers are further formed from an insulating material.

17. The system of claim 10, wherein the dispersal module further comprises a second charging element downstream of the first charging element.

18. The system of claim 17, wherein the second charging element comprises a pair of charged surfaces having an opposite electric charge from the dispersed woven fabric tape.

19. The system of claim 10, wherein the polymer material is one of poly-vinyl alcohol (PVA) and poly-vinyl butyral (PVB).

20. The system of claim 10, wherein the applicator is a conventional or elect